United States Patent
Glidden et al.

(10) Patent No.: US 7,072,196 B1
(45) Date of Patent: Jul. 4, 2006

(54) MULTI-STAGE HIGH VOLTAGE SOLID STATE SWITCH

(75) Inventors: Steven C. Glidden, Ithaca, NY (US); Howard D. Sanders, Ithaca, NY (US)

(73) Assignee: Applied Pulsed Power, Inc., Ithaca, NY (US)

( * ) Notice: Subject to any disclaimer, the term of this patent is extended or adjusted under 35 U.S.C. 154(b) by 0 days.

(21) Appl. No.: 10/905,982

(22) Filed: Jan. 28, 2005

(51) Int. Cl.
*H02M 3/24* (2006.01)

(52) U.S. Cl. .......................... 363/96; 363/57; 363/135

(58) Field of Classification Search ............... 363/18, 363/19, 95, 96, 56.09, 56.1, 56.12, 57, 135
See application file for complete search history.

(56) References Cited

U.S. PATENT DOCUMENTS

| | | | | |
|---|---|---|---|---|
| 3,761,667 A | * | 9/1973 | Walden | 219/625 |
| 3,859,587 A | * | 1/1975 | Brown | 363/135 |
| 4,231,083 A | * | 10/1980 | Matsuda et al. | 363/135 |
| 4,415,963 A | * | 11/1983 | Rippel et al. | 363/135 |
| 4,442,480 A | * | 4/1984 | Downhower et al. | 363/57 |
| 4,460,949 A | * | 7/1984 | Steigerwald | 363/28 |
| 4,477,868 A | * | 10/1984 | Steigerwald | 363/28 |
| 5,180,963 A | | 1/1993 | El-Sharkawi | 323/211 |
| 5,444,610 A | | 8/1995 | Gaudreau | 363/54 |
| 5,646,833 A | | 7/1997 | Gaudreau | 363/54 |
| 5,933,335 A | | 8/1999 | Hitchcock | 363/25 |
| 6,396,672 B1 | | 5/2002 | Deam | 361/91.7 |
| 6,624,684 B1 | | 9/2003 | Glidden | 327/438 |
| 6,710,994 B1 | | 3/2004 | Deam | 361/100 |

* cited by examiner

*Primary Examiner*—Bao Q. Vu
(74) *Attorney, Agent, or Firm*—Brown & Michaels, PC

(57) ABSTRACT

A method for triggering a high voltage solid state switch comprised of a set of thyristors connected in series. Initiating switch turn-on requires command triggering of only the lowest voltage thyristor, thereby eliminating the need for expensive high voltage pulse transformers or optically isolated triggers. Triggering of one thyristor causes a redistribution of voltage across the switch, generating a current flowing through the snubber circuit across each untriggered thyristor. This current is coupled to the gate of each thyristor causing all of them to turn on simultaneously. This results in an inexpensive method for triggering a high voltage solid state switch.

11 Claims, 5 Drawing Sheets

MULTI-STAGE HIGH VOLTAGE SOLID STATE SWITCH

BACKGROUND OF THE INVENTION

1. Field of the Invention

The invention pertains to the field of high voltage solid state switches. More particularly, the invention pertains to triggering a high voltage solid state switch comprised of a set of solid state devices connected in series.

2. Description of Related Art

Spark gap, krytron, thyratron, sprytron, and other high voltage switches are used in many military, research, medical, and commercial applications where switching of tens of kilovolts and thousands of amperes is required. It is desirable to replace these switches with solid state switches having similar operational characteristics but with longer lifetimes.

Because existing commercial solid state high power devices, such as insulated gate bipolar transistors (IGBTs), metal-oxide semiconductor field-effect transistors (MOSFETs) and thyristors, cannot operate at tens of kilovolts, multiple devices in series are required. In many cases a snubber circuit is also required for proper operation. A snubber circuit may be used to ensure equal voltage distribution between the multiple devices in series as the voltage across the switch changes. A capacitor in series with a resistor can serve as the snubber circuit.

Triggering the individual devices can be a complicated task, since each device is floating at a different voltage. One means of triggering such devices uses a large pulse transformer, with appropriate high voltage isolation between the primary and secondary windings and with high voltage isolation between the multiple secondary windings, in order to bring the low voltage trigger pulse to the devices. Because of the inefficiency, size and cost of the large pulse transformer, this method becomes less desirable as the switch voltage and number of series connected devices increases.

In response, methods were developed using power stored in a capacitor floating with the device for the trigger energy. These methods used low power triggers for a low power solid state device that discharged the capacitor into the gate of the high power device. While still requiring a pulse transformer, because of the lower energy requirements, it could be smaller. General examples of these switches can be seen in U.S. Pat. Nos. 5,444,610 and 5,646,833.

U.S. Pat. Nos. 6,396,672 and 6,710,994 describe triggering systems that use the energy stored in a snubber capacitor to provide the necessary energy to trigger a solid state device. U.S. Pat. No. 6,624,684 describes a compact method for triggering multiple solid state devices connected in series, again using the energy stored in a snubber capacitor to provide the energy to trigger the solid state device. With these, either a low power electrical signal through a pulse transformer or an optical signal can be used to trigger the switch.

U.S. Pat. Nos. 5,933,335 and 5,180,963 are examples of an optically triggered switch. In U.S. Pat. No. 5,180,963, there is an optical signal for each set of two high power solid state devices. The optical signal triggers a phototransistor which in turn triggers a low power solid state device. The low power solid state device then discharges a capacitor through a pulse transformer, producing signals in the gates of the two high power solid state devices that turn on the devices.

In all of these types of switches, multiple phototransistors, pulse transformers, low power solid state devices, and other components, are required, a set for each high power solid state device being triggered. These components cause the high voltage solid state switch to be larger and more expensive, on top of the already large price for the high voltage solid state devices.

SUMMARY OF THE INVENTION

This invention is a method of triggering a high voltage solid state switch comprised of a set of solid state devices such as thyristors connected in series. The thyristors all have snubber circuits.

To close the switch, only one thyristor is triggered. The triggering of one thyristor causes the voltage drop across it to begin to fall, and the voltage drop across the other devices to rise. This results in a current flowing through the snubber circuits to charge the snubber capacitors. The magnitude of this current is proportional to the product of the snubber capacitance and the rate of increase of the voltage, and can be tens of amperes or more if the command triggered stage turns on rapidly, as is usually required for high current switches.

This current flows from the external circuit which supplies the required energy. Because the capacitance of the snubber capacitors is small this energy is a very small fraction of the total switched energy. Using a transformer or other passive components, a portion of the snubber current is coupled to the gates of the thyristors, triggering the thyristors. The thyristor stages are connected in series and experience the same snubber current, resulting in simultaneous turn-on of all these stages.

The components used to initiate triggering of each stage are at the potential of that stage so that no high voltage isolation is required. This makes for a compact, inexpensive triggering system enabling thyristor stages to be stacked in series to create very high voltage switches. If the cathode end of the switch is at ground potential, it is not necessary to insulate the command trigger for high voltage.

Although the description above has been in terms of "thyristors", it will be understood by one skilled in the art that other fast turn-on solid state devices, such as IGBTs or MOSFETs, can also be used.

The result of this method is a small increase in turn-on time and in switch inductance. For example, turn-on times may increase from 60 ns to 100 ns and inductance from 10 nH per device to 15 nH per device. Also, there must be an order of magnitude or more between the off-state recharge current and the triggered current through the snubber circuit. This last factor will limit the maximum duty cycle [duty cycle=on time/(on time+off time)] of the switch to about 1%. Typical applications for high power switches have these small duty cycles.

These switches would be used as replacements for spark gap, krytron, thyratron, sprytron, and other high voltage switches used in pulsed power systems for electromagnets, lasers, ion sources, X-ray sources, medical equipment, crowbars, and other applications.

DETAILED DESCRIPTION OF THE INVENTION

Figure 1:
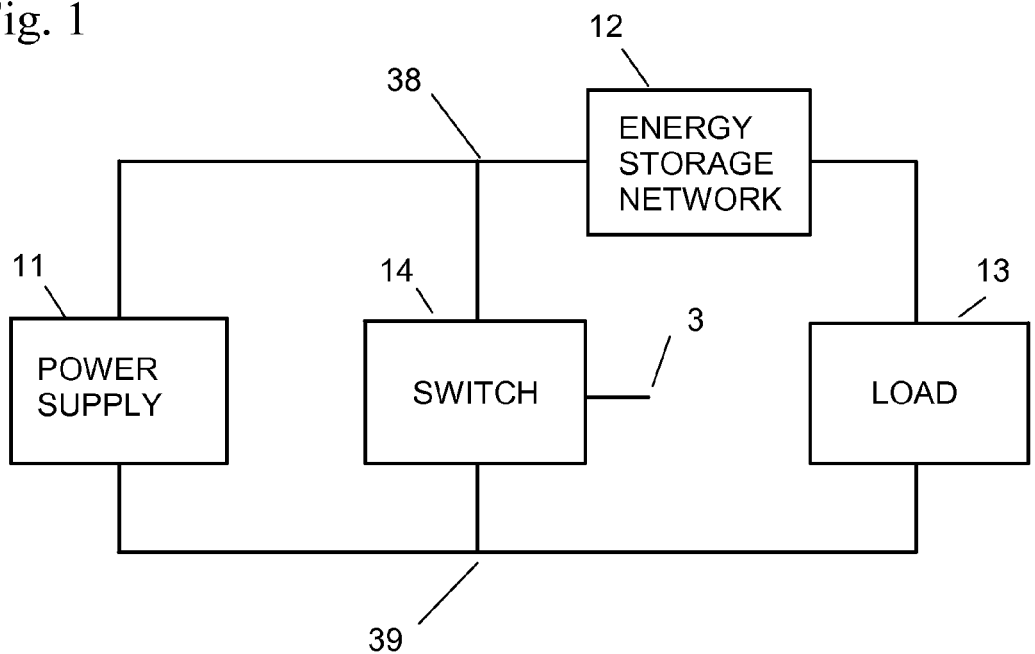
FIG. 1 shows a block diagram of a typical application using the switch

A typical application of the switch described in this invention is shown in FIG. 1. The power supply 11 is used to charge the energy storage network 12. The energy storage network 12 can be a single capacitor, a transmission line or a pulse forming network. Switch 14 is closed, discharging the energy storage network 12 into the load 13. Typically the charging time of the energy storage network 12 is two or more orders of magnitude greater than the discharge time. It should be noted that the arrangement in FIG. 1 is the most common approach because it allows one end of the switch to be at ground. Charging is thru the load and the power supply disables itself during the short discharge period of the Energy Storage Network. FIG. 1 is only one of many circuits where the switch is useful. Alternatively, the positions of the switch and the Energy Storage Network could be reversed.

Figure 2:
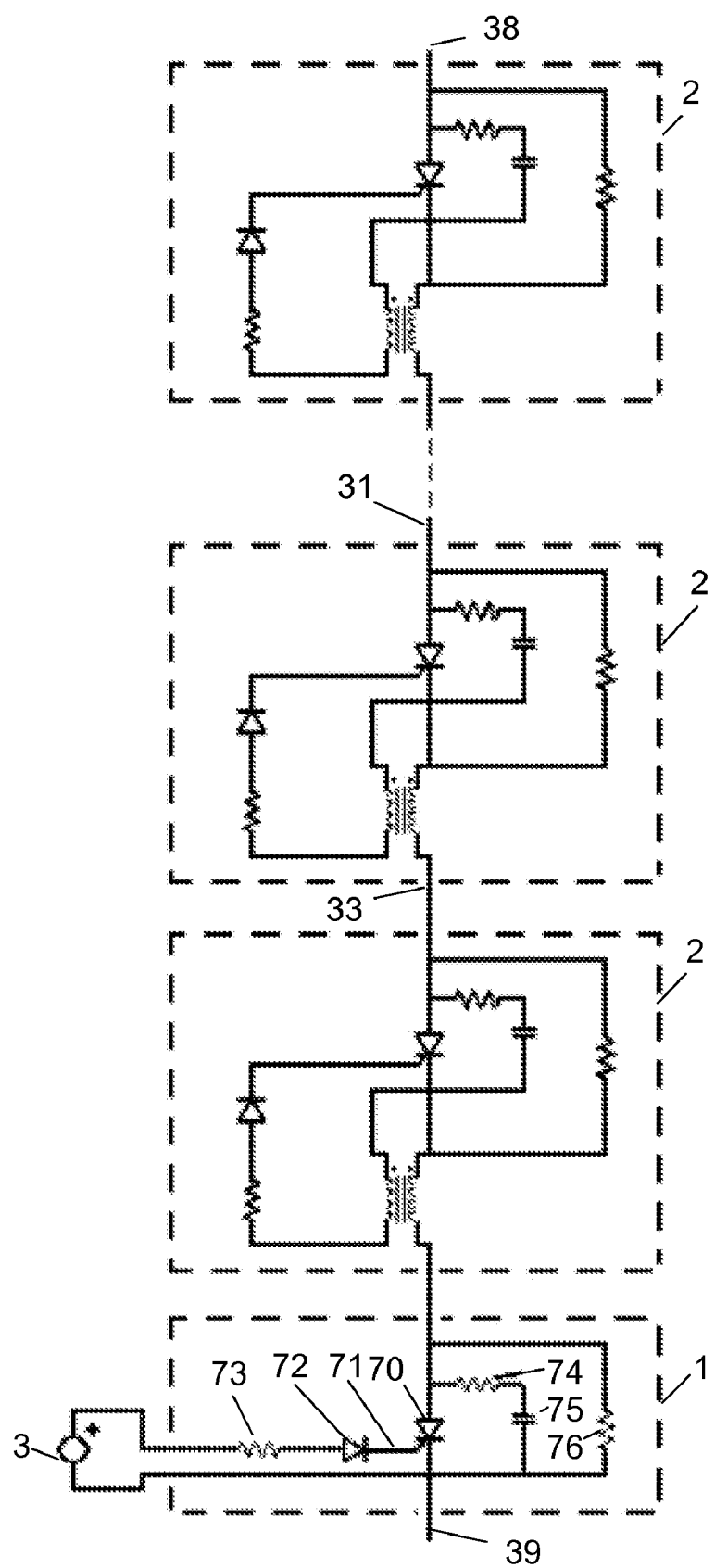
FIG. 2 shows a simplified schematic diagram of the switch, using a number of stages

A block diagram of the switch 14 of the invention is shown in FIG. 2. Multiple stages, connected in series, are used to make switches with voltage hold-off capabilities that are much greater than would be possible with a single stage.

The switch has a command triggered stage 1 in series with one or more auto-triggered stages 2. In FIG. 2 the command triggered stage 1 is shown located at one end of the switch 14. This is convenient if this end of the switch is at ground potential. However, the command triggered stage 1 can be located anywhere in the switch stack and the switch performance will be unaltered.

As can be seen in FIG. 2, the command triggered stage 1 is a conventional switch stage, shown here as a thyristor 70, whose gate 71 is triggered through gate diode 72 and gate resistor 73. A snubber circuit comprising capacitor 75 and resistor 74, as well as parallel resistor 76, help maintain equal voltage sharing between this stage and the others. A gate drive unit 3 is used to trigger the command triggered stage 1.

Figure 3:
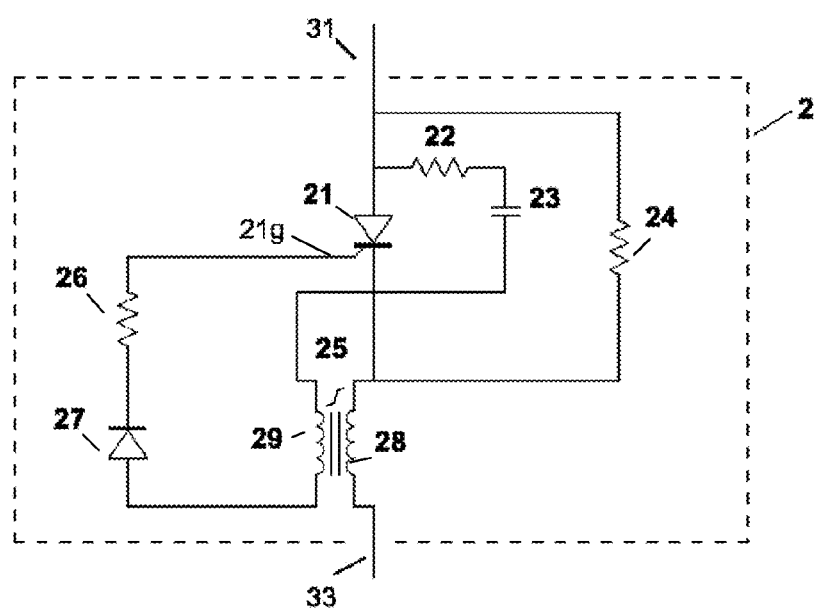
FIG. 3 shows a schematic of one auto triggered stage of the switch

A schematic for one implementation of the auto triggered stage 2 of the switch 14 is shown in FIG. 3. Connections 31 and 33 link to the adjoining stages in the switch. Thyristor 21 typically has a voltage hold-off greater than 1 kV and can conduct greater than 1 kA for short pulses at high rates of current risetime. Resistor 24, which typically has a resistance of 100 Kohm to 100 Mohm, is in parallel with the thyristor 21 and helps insure equal voltage sharing between the series connected switch stages. Snubber capacitor 23 and resistor 22 have several functions. One function is that they help maintain equal voltage sharing between the series connected switch stages during turn-on and turn-off of each stage. The energy stored in capacitor 23 is discharged through thyristor 21 as the thyristor begins to turn on. This can increase the rate of turn-on.

Trigger transformer 25 has a saturable magnetic core. The primary 28 of the transformer 25 is connected in series with the thyristor 21. The secondary 29 is connected to the gate through gate diode 27 and gate resistor 26. The gate diode 27 prevents reverse current from flowing through the gate, which can damage some types of thyristors. Gate resistor 26 limits the peak gate current. Some thyristors may require additional components for gate control.

The auto triggered stages are connected in series and experience the same snubber current, resulting in simultaneous turn-on of all these stages. For switches requiring a large number of stages it may be desirable to use several command triggered stages to increase the dv/dt across the auto triggered stages in order to increase the snubber current.

The auto-triggered stage works as follows:

a) The command triggered stage 1 is triggered and the voltage across this stage begins to fall.

b) Because the remaining switch stages are still in the off state and the total voltage across the switch remains the same, the voltage across these stages begins to increase. As an example, if there are N identical auto triggered stages, then the voltage across each auto triggered stage rises from $(V_{switch}-V_{comand\ triggered\ stage})/N$ to $V_{switch}/N$. For fast switching thyristors the auto trigger stages will start to turn on well before the $V_{switch}/N$ voltage is reached.

c) In order for the voltage across each stage to increase, current must flow through the snubber resistor 22 to charge the snubber capacitor 23.

The magnitude of the current is proportional to the product of the snubber capacitance and the rate of increase of the stage voltage. The peak current can be tens of amperes or more if the command stage turns on rapidly, as is usually required for high current switches.

d) This current flows from the external power supply 11 or the energy storage network 12 and through the switch. As can be seen in FIG. 3 this current flows through the primary 28 of transformer 25.

e) This results in a current through the secondary 29, gate resistor 26, gate diode 27, and thyristor gate 21g which turns on thyristor 21. The volt second product of the saturable magnetic core transformer 25 is selected based on the turn-on characteristics of thyristor 21.

f) As the switch begins to turn-on, the transformer saturates and the primary inductance falls to a value as low as a few nanohenries, and the voltage drop across the primary becomes very small.

The trigger transformer can be designed so that after saturation there is still sufficient voltage across the secondary to provide positive gate current as long as the switch is conducting. The primary inductance adds to the total inductance of the switch. However, for fast turn-on thyristors, a one turn primary winding can be made by routing the cathode lead of the thyristor through a small toroidal core. Then the inductance of this winding, when the core saturates, can be small compared to the total stage inductance.

The rate of change of the voltage (dv/dt) across the switch when the energy storage network is charged must be much smaller than the dv/dt during the initial turn-on phase in order to keep the snubber current below that required to initiate turn-on of the thyristor. This is usually the case for high-power low-duty cycle applications.

For example, a switch operating at 24 kV and discharging 100 times a second will experience a dv/dt of ~3 V/microsecond during the charging phase and >1000 V/microsecond during the initial turn-on phase. The value of the snubber capacitance and the design of the trigger transformer must be selected to avoid auto triggering of the switch during the charging phase.

During the initial turn-on phase, the voltage across the auto triggered stages increases. Some of this increased voltage is dropped across the trigger transformer, the rest is added to the initial voltage drop across the thyristor. Because thyristors typically should be operated at no more than 60–75% of their maximum holdoff voltage to prevent spurious triggering, this increase in voltage, present for <1 microseconds, will not exceed the thyristors' ratings. For most applications this means no more stages are required than would be for a switch in which all stages are command triggered.

Figure 4:
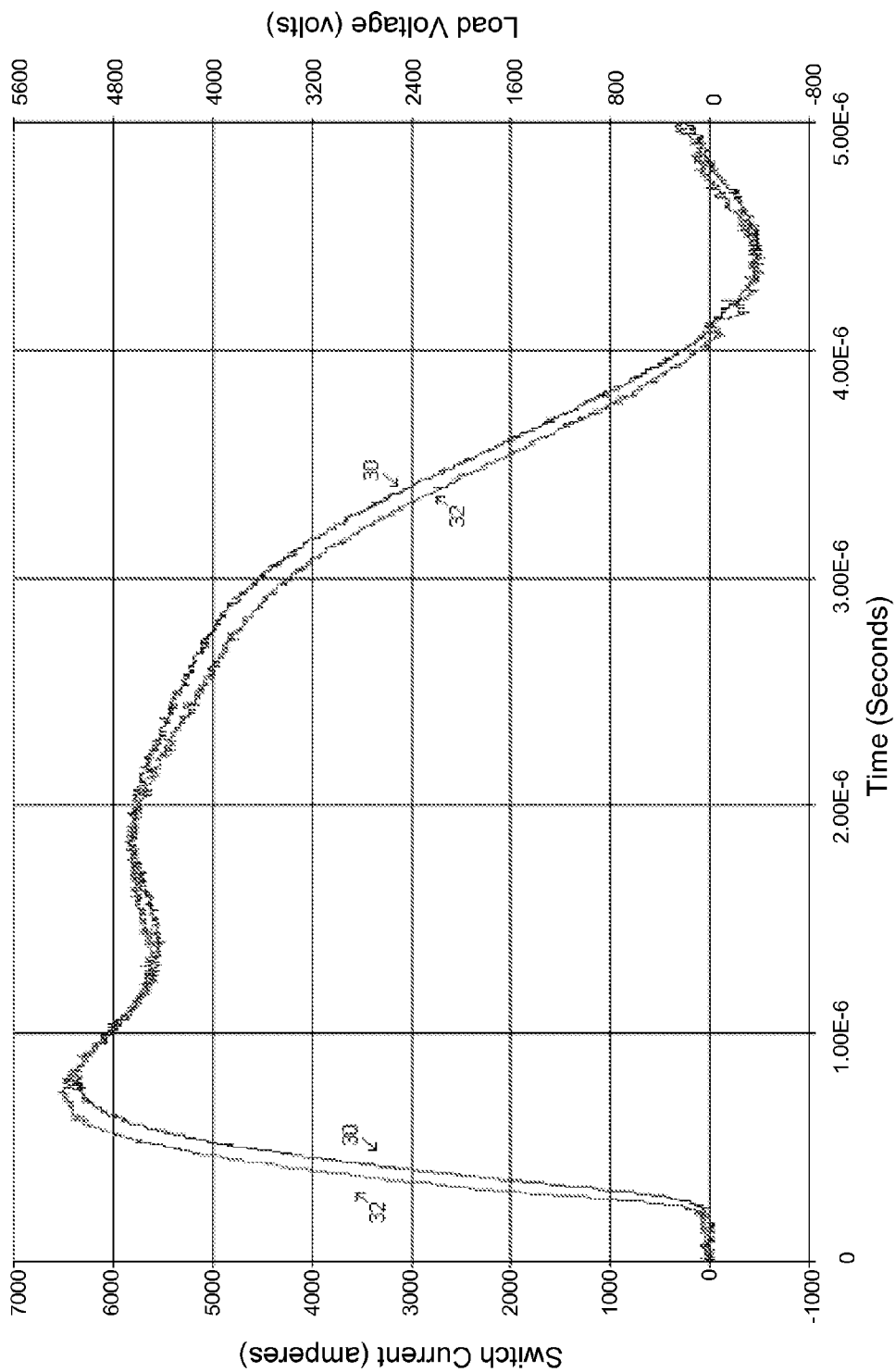
FIG. 4 shows current and load voltage waveforms for the switch of the invention

FIG. 4 shows switch current 30 and load voltage 32 waveforms from a switch consisting of one command and two auto triggered stages, where the switch is discharging a 1.65 microfarad PFN, charged to 10 kV, into a 0.8 ohm load.

Figure 5:
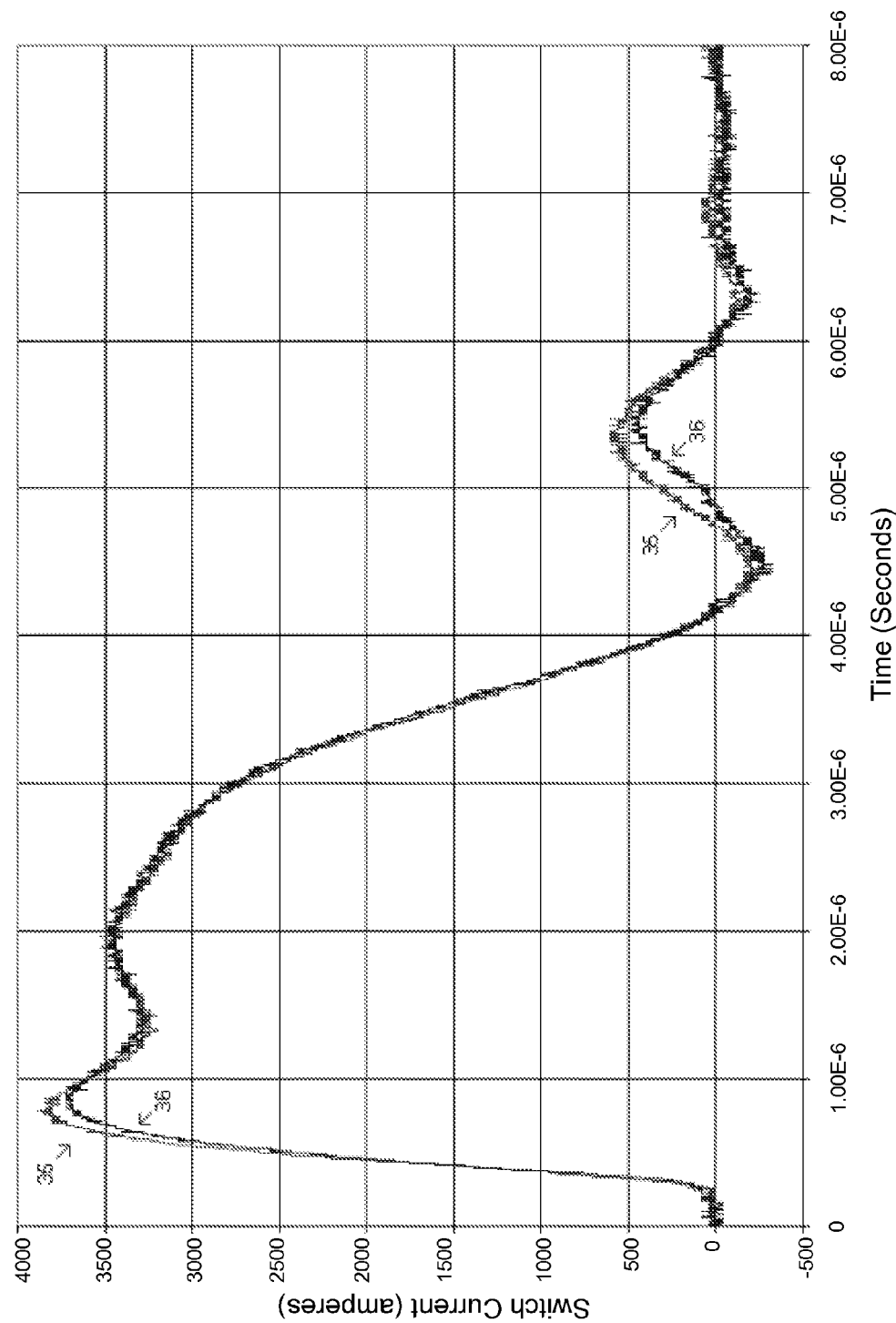
FIG. 5 shows a comparison of switch current waveforms for the switch of the invention and a conventionally triggered switch

The auto triggered switch does not have significantly different on-state characteristics from a command triggered switch. This can be seen in FIG. 5, which shows a comparison between the switch current 36 for an auto triggered switch, comprising 1 command triggered stage and 2 auto triggered stages, with the switch current 35 from a 2 stage command triggered switch. Both cases are the result of a 1.65 microfarad 1 Ohm PFN, charged to 6 kV, discharging through the switches and a 0.8 ohm load.

Figure 6:
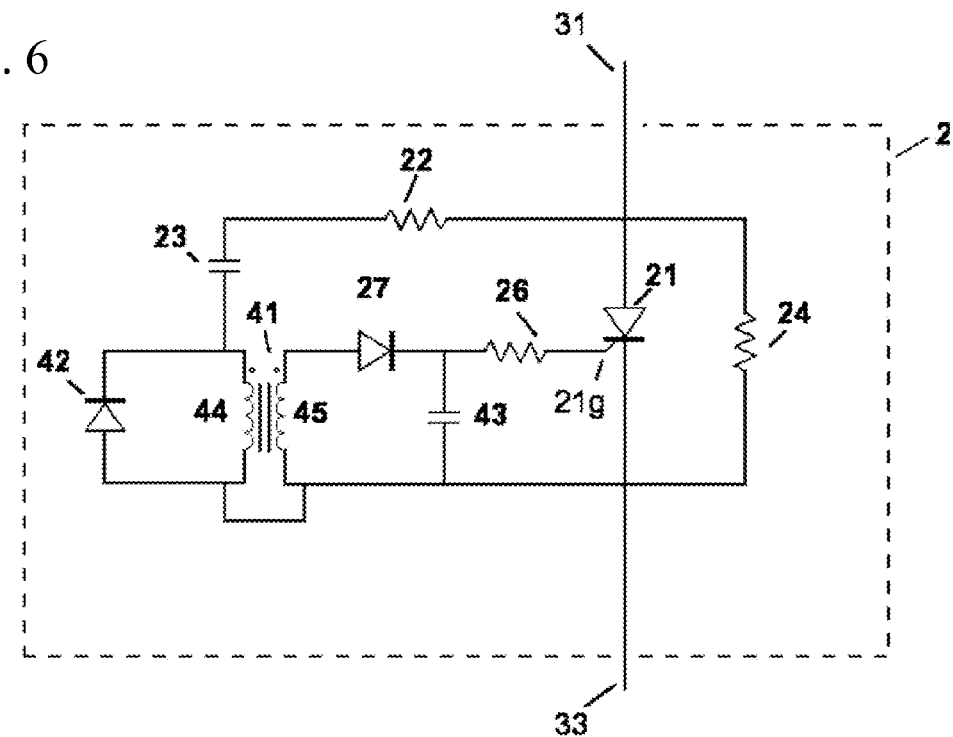
FIG. 6 shows a schematic of an alternate implementation of the auto triggered stage

An alternate implementation of the auto triggered stage is shown in FIG. 6. In this circuit the primary 44 of trigger transformer 41 is in series with the snubber resistor 22 and snubber capacitor 23 but is not in series with the thyristor 21. When the command triggered stage begins to turn on, the resulting increase in snubber current through the primary 44 of transformer 41 produces a current pulse in the secondary 45, triggering thyristor 21 as in the previously described approach. However it is not necessary for the transformer to saturate. When thyristor 21 turns on the snubber current reverses direction as the snubber capacitor is discharged through the thyristor 21. A diode 42 conducts this current, bypassing the primary 44 of transformer 41. Gate capacitor 43 is charged during the initial turn on phase and provides some gate drive current during the conduction phase. Increasing the value of gate capacitor 43 increases the gate current during the conduction phase but slows the risetime of the gate current during the turn-on phase.

The circuit of FIG. 6 can be implemented using resistors, varistors, or inductors, in place of the trigger transformer.

Figure 7:
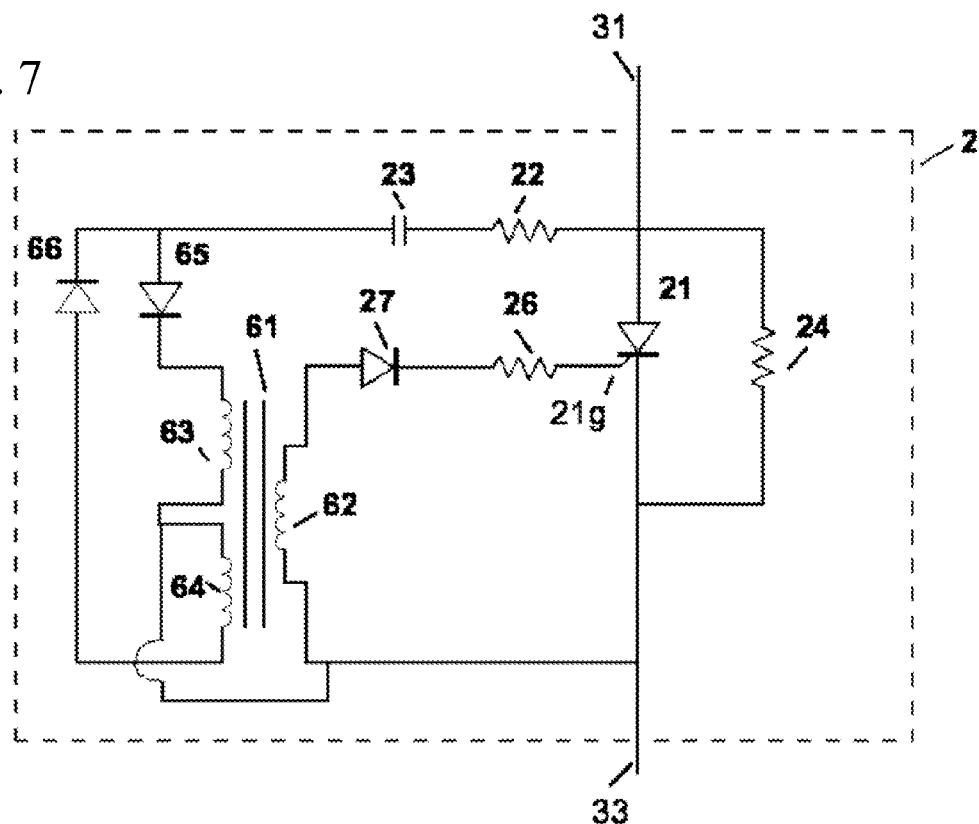
FIG. 7 shows a schematic of a third implementation of the auto triggered stage

A variation of the circuit of FIG. 6 is shown in FIG. 7. Here trigger transformer 61 has two primary windings 63, 64. Diode 65 conducts the snubber current through primary 63 during the turn-on phase, initiating triggering of thyristor 21 as before. Diode 66 blocks current from flowing through primary 64. When the thyristor 21 turns on and the snubber current reverses direction, diode 66 conducts current through primary 64. The direction of primary winding 64 is such that this primary current produces a current in the secondary 62 that provides positive gate drive current during the conduction phase.

The technique of the invention is particularly useful with fast turn-on thyristors, such as the Solidtron™ thyristors sold by Silicon Power Corporation. Although the description above has been in terms of "thyristors", it will be understood by one skilled in the art that other fast turn-on solid state devices, such as IGBT's, MOSFETs, can also be used.

Accordingly, it is to be understood that the embodiments of the invention herein described are merely illustrative of the application of the principles of the invention. Reference herein to the details of the illustrated embodiments is not intended to limit the scope of the claims, which themselves recite those features regarded as essential to the invention.

What is claimed is:

1. A multi-stage high voltage solid state switch comprising:
    a) at least one command triggered stage, comprising:
        i) a current input;
        ii) a current output;
        iii) a trigger input; and
        iv) a solid state device comprising a control input coupled to the trigger input of the command triggered stage and a controlled current path controllably coupling the input of the command triggered stage to the output of the command triggered stage, such that a command signal on the trigger input causes the solid state device to conduct current on the current path;
    b) at least one auto-triggered stage, comprising:
        i) a current input;
        ii) a current output;
        iii) a solid state device comprising a control input and a controlled current path controllably coupling the input of the command triggered stage to the output of the command triggered stage, such that a trigger signal on the control input causes the solid state device to conduct current on the current path;
        iv) a snubber circuit in parallel with controlled current path of the solid state device; and
        iv) an auto-trigger circuit coupled to the current path, having a trigger output coupled to the control input of the solid state device, such that current flow in the current path causes the trigger circuit to produce a trigger signal on the trigger output, causing the solid state device to conduct current on the current path;
    the at least one auto-triggered stage and the at least one control triggered stage being connected in series, so that when the command signal on the trigger input of the control triggered stage causes the control triggered stage to conduct current, the auto trigger circuit of each of the auto-triggered stages causes each of the auto-triggered stages to conduct current, and a current path through all of the stages of the switch is turned on.

2. The switch of claim 1, in which the solid state devices are thyristors.

3. The switch of claim 1, in which the snubber circuit of the one auto-triggered stage comprises a resistor and capacitor in series.

4. The switch of claim 1, in which the auto-triggered stage further comprises a balancing resistor in series with the current path of the solid state device.

5. The switch of claim 1, in which the auto-trigger circuit of the auto-triggered stage comprises a trigger transformer having a primary winding in series with the current path and a secondary winding coupled to the control input of the solid state device.

6. The switch of claim 5, in which the trigger transformer further comprises a saturable magnetic core.

7. The switch of claim 6, in which after saturation there is still sufficient voltage across the secondary to provide positive current to the control input of the solid state device as long as the switch is conducting.

8. The switch of claim 1, in which the auto-trigger circuit of the auto-triggered stage comprises a trigger transformer having a primary winding in series with the snubber circuit and a secondary winding coupled to the control input of the solid state device.

9. The switch of claim 8, further comprising a diode in parallel with the primary winding of the trigger transformer, bypassing reversed snubber discharge current.

10. The switch of claim 8, in which the secondary winding of the trigger transformer is coupled to the control input of the solid state device by a series circuit comprising a diode and a resistor, and further comprising a gate capacitor coupled to the current path and to a junction between the diode and the resistor of the series circuit coupling the primary winding to the control input.

11. The switch of claim 8, in which the trigger transformer comprises an additional primary winding in series with a diode which blocks current from flowing through the additional primary, so that when the solid state device turns on and current in the snubber circuit current reverses direction, the diode conducts current through the additional primary winding, the direction of the additional primary winding being such that current in the additional primary winding produces a current in the secondary winding which provides positive current to the control input of the solid state device as long as the switch is conducting.

* * * * *